United States Patent [19]

Tsukamoto

[11] Patent Number: 5,474,940
[45] Date of Patent: Dec. 12, 1995

[54] METHOD OF FABRICATING A SEMICONDUCTOR DEVICE HAVING SHALLOW JUNCTIONS IN SOURCE-DRAIN REGIONS AND A GATE ELECTRODE WITH A LOW RESISTANCE SILICIDE LAYER

[75] Inventor: Hironori Tsukamoto, Kanagawa, Japan

[73] Assignee: Sony Corporation, Tokyo, Japan

[21] Appl. No.: 320,828

[22] Filed: Oct. 7, 1994

Related U.S. Application Data

[63] Continuation of Ser. No. 2,411, Jan. 8, 1993, abandoned.

[30] Foreign Application Priority Data

Jan. 8, 1992 [JP] Japan ..................................... 4-018341

[51] Int. Cl.⁶ ..................... H01L 21/26; H01L 21/265; H01L 21/306; H01L 21/479
[52] U.S. Cl. .................. 437/19; 437/44; 437/45; 437/174; 437/907
[58] Field of Search .................................... 437/907, 908, 437/19, 950, 173, 174, 44, 45; 148/DIG. 91, DIG. 92, DIG. 93, DIG. 94

[56] References Cited

U.S. PATENT DOCUMENTS

| | | | |
|---|---|---|---|
| 4,330,931 | 5/1982 | Liu | 437/41 |
| 4,406,053 | 9/1983 | Takasaki et al. | 437/174 |
| 4,434,013 | 2/1984 | Bol | 437/907 |
| 4,443,930 | 4/1984 | Hwang et al. | 437/984 |
| 4,468,855 | 9/1984 | Sasaki | 437/29 |
| 4,555,842 | 12/1985 | Levinstein et al. | 29/571 |
| 4,621,411 | 11/1986 | Havemann et al. | 437/907 |
| 4,651,408 | 3/1987 | MacElwee et al. | 148/DIG. 91 |
| 4,682,408 | 7/1987 | Takebayashi | 148/DIG. 85 |
| 4,710,477 | 12/1987 | Chen | 437/34 |
| 4,914,500 | 4/1990 | Liu et al. | 437/912 |
| 4,956,311 | 9/1990 | Liou et al. | 437/45 |
| 5,183,780 | 2/1993 | Noguchi et al. | 437/173 |
| 5,190,886 | 3/1993 | Asahina | 437/192 |
| 5,272,361 | 12/1993 | Yamazaki | 257/66 |
| 5,399,506 | 3/1995 | Tsukamoto | 437/19 |
| 5,401,666 | 3/1995 | Tsukamoto | 437/41 |

FOREIGN PATENT DOCUMENTS

| | | | |
|---|---|---|---|
| 55-67132 | 5/1980 | Japan | 437/907 |
| 55-111170A | 8/1980 | Japan | 437/908 |
| 6-77155A | 8/1992 | Japan | 437/907 |

OTHER PUBLICATIONS

1 Stanley Wolf and Richard N. Tauber, Silicon Processing For The VLSI Era 384–388 (1986).

Primary Examiner—Olik Chaudhuri
Assistant Examiner—Brian K. Dutton
Attorney, Agent, or Firm—Hill, Steadman & Simpson

[57] ABSTRACT

A method of fabricating a semiconductor device comprises: a first annealing process for annealing a semiconductor substrate provided with element isolating regions and gate electrode regions; and a second annealing process for annealing the semiconductor substrate further provided with source-drain regions with a pulse laser beam. The first annealing process is a furnace annealing process of a rapid thermal annealing process. Most preferably, the pulse laser beam may be emitted by a XeF laser which emits a laser beam of 351 nm in wavelength or a XeCl laser which emits a laser beam of 308 nm in wavelength. The first annealing process activates electrically relatively thick conductive layers formed in the element isolating regions and gate electrode regions and forms a silicide layer of a low resistance over the gate electrode regions. The second annealing process forms relatively shallow junctions in the source-drain regions.

11 Claims, 2 Drawing Sheets

FIG. I(A)
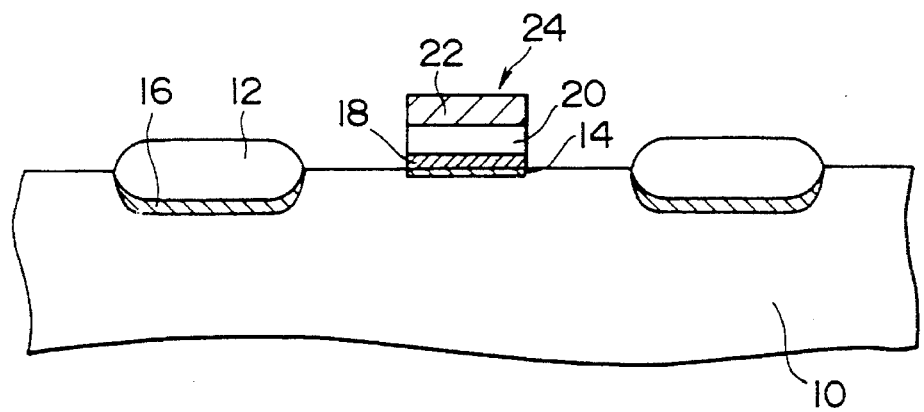
FIG. I(B)
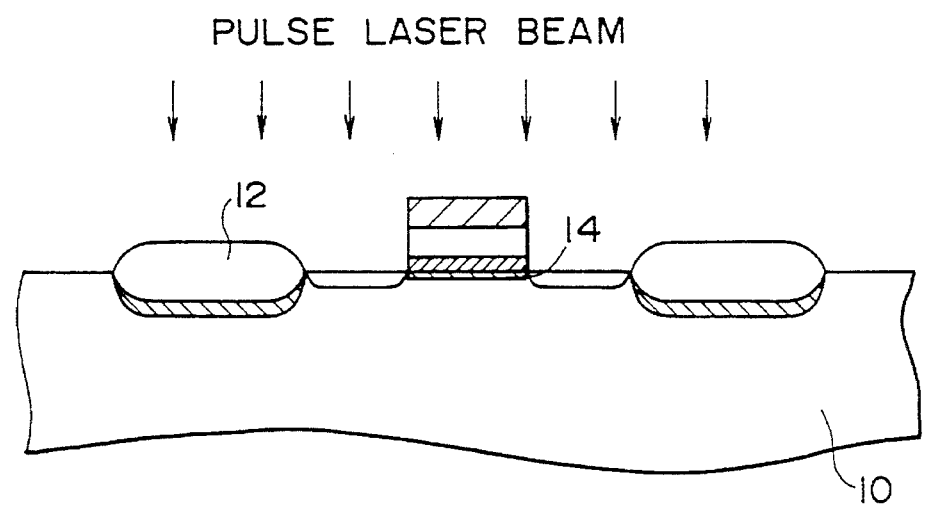
FIG. I(C)
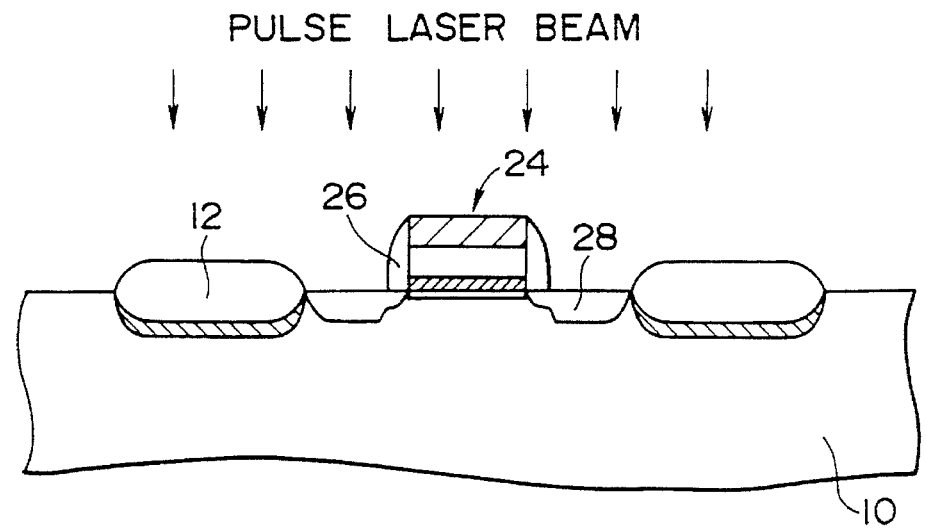

METHOD OF FABRICATING A SEMICONDUCTOR DEVICE HAVING SHALLOW JUNCTIONS IN SOURCE-DRAIN REGIONS AND A GATE ELECTRODE WITH A LOW RESISTANCE SILICIDE LAYER

This is a continuation of application Ser. No. 08/002,411, filed Jan. 8, 1993, now abandoned.

BACKGROUND OF THE INVENTION

1. Field of the Invention

The present invention relates to a method of fabricating a semiconductor device and, more specifically, to an annealing process in a method of fabricating a semiconductor device.

2. Description of the Related Art

When fabricating a semiconductor device, a plurality of semiconductor elements are formed on a semiconductor substrate, and the semiconductor substrate carrying the semiconductor elements is subjected to a high-temperature heat treatment to isolate the semiconductor elements from each other or to connect the semiconductor elements. The semiconductor substrate is subjected to an ion implanting process to form lightly doped drain (LDD) structures and source-drain regions in the surface thereof. The semiconductor substrate processed by the ion implanting process needs to be subjected to an activating annealing process to restore the crystallinity of the semiconductor substrate and to electrically activate acceptor ions and doner ions implanted in the surface of the semiconductor substrate.

Silicides, such as the silicides of metals having high melting points such as W, Mo and Ti, Pt and Pd, are used because the electrical resistance of silicides is lower than that of polycrystalline silicon. The depth of penetration of a laser beam into a silicide film is on the order of several tens nanometers. Furthermore, silicides need to be heated to a high temperature by a high-temperature heat-treating process to reduce contact resistance. A furnace annealing method and a rapid thermal annealing method have been applied to the activating annealing process and the high-temperature heat-treating process.

The component semiconductor elements of a semiconductor device of a high degree of integration are miniaturized, requiring shallow junctions in the source-drain regions. When the semiconductor substrate is annealed for activating annealing by the furnace annealing method or the rapid thermal annealing method, the depth of the diffused layer is increased and, consequently, it is impossible to form shallow junctions in the source-drain regions to miniaturize the component semiconductor elements to form the semiconductor device in a high degree of integration. An activating annealing method employing a pulse laser beam is one of the shallow junction forming methods.

The depth of a layer which can be annealed by a pulse laser beam is 100 nm or less because the energy of the pulse laser beam is absorbed by the very thin surface layer of a thickness of about 20 nm of the semiconductor substrate. Therefore, the annealing method employing a pulse laser beam is suitable for the activating annealing for forming LDD structures or source-drain regions. However, it is difficult to reduce the resistance of the entire area of a portion of the silicide layer extending over the gate electrode simultaneously with the activating annealing of the LDD structures and source-drain regions because a silicide layer formed, for example, over a gate electrode has a thickness of 100 nm or above.

Such a difficulty may be overcome by using a laser having a higher power capacity. However, a pulse laser beam having increased energy causes the acceptor ions and doner ions to diffuse into the depth of the source-drain regions to form deep junctions in the LDD structures or source-drain regions. If the pulse laser beam has low energy, only the surface layer of a very small thickness of the semiconductor substrate is melted and the surface of the semiconductor substrate becomes flat immediately after the removal of the pulse laser beam. On the other hand, when a pulse laser beam of high energy is used, the surface layer of a considerably large thickness of the semiconductor substrate is melted to deteriorate the flatness and smoothness of the surface of the semiconductor substrate. Furthermore, it is difficult to process a plurality of regions differing from each other in thickness or depth simultaneously with such a pulse laser beam having high energy.

It is very difficult to apply a laser beam annealing process to fabricating a semiconductor device having a plurality of laminated layers because the pulse laser beam is intercepted by the upper layers and unable to reach the lower layers.

SUMMARY OF THE INVENTION

Accordingly, it is an object of the present invention to provide a method of fabricating a semiconductor device by employing a pulse laser beam and capable of forming shallow junctions in minute semiconductor elements of the semiconductor device.

In one aspect of the present invention, a method of fabricating a semiconductor device comprises: a first annealing process for annealing a semiconductor substrate provided with element isolating regions and gate electrode regions; and a second annealing process for annealing the semiconductor substrate further provided with source-drain regions with a pulse laser beam.

The first annealing process is a furnace annealing process or a rapid thermal annealing process.

If LDD structures are formed in a LDD structure forming process between the first and second annealing processes, it is desirable to anneal the semiconductor substrate with the pulse laser beam after ion implantation for forming the LDD structures.

Preferably, furnace annealing conditions are an annealing temperature in the range of 850° to 1150° C. and an annealing time in the range of 10 to 30 min, and more preferably, an annealing temperature in the range of 950° to 1050° C. and an annealing time in the range of 10 to 30 min. Preferably, rapid thermal annealing conditions are an annealing temperature in the range of 850° to 1150° C. and an annealing time in the range of 5 to 10 sec, and more preferably, an annealing temperature in the range of 1000° to 1150° C. and an annealing time in the range of 5 to 10 sec.

A ruby laser (wavelength: 694 nm), a XeF laser (wavelength: 351 nm), a XeCl laser (wavelength: 308 nm), KrF laser (wavelength: 249 nm) or an ArF laser (wavelength: 193 nm) may be employed for pulse laser beam annealing. The XeF laser or XeCl laser is most desirable because, as shown in FIG. 2, the absorption coefficient of a silicon crystal and that of a silicon crystal implanted with boron ions are substantially equal to each other in the wavelength region of a XeF laser beam or a XeCl laser beam. Preferably, the energy of a pulse laser beam for pulse laser beam annealing in the range of 650 to 1100 mJ/cm$^2$, more preferably, in the range of 700 to 800 mJ/cm$^2$. A preferable pulse width is in the range of 20 to 100 nsec.

The first annealing process for the furnace annealing or rapid thermal annealing of the element isolating regions and gate electrode regions activates electrically comparatively thick conductive layers and base layers formed in the element isolating regions and gate electrode regions, and is capable of forming a uniform silicide layer having a low resistance over the gate electrodes.

The second annealing process using a pulse laser beam influences only a thin surface layer of a thickness of 100 nm or less of the semiconductor substrate. Shallow junctions are formed in the source-drain regions, so that the method of the present invention is applicable for fabricating a semiconductor device consisting of minute semiconductor elements and having a high degree of integration.

When forming a LDD structure, a semiconductor substrate is subjected, if necessary, to a pulse laser beam process after an ion implanting process for forming the LDD structure to maintain a shallow junction in the LDD structure, which enables fabricating a semiconductor device consisting of minute semiconductor elements and having a high degree of integration.

After the processes of the present invention have been completed, a conventional method of fabricating a semiconductor device is carried out to complete the semiconductor device. It is noted that the semiconductor substrate is heated at a temperature of 600° C. or below in the heat treatment processes following the high-temperature heat treatment process employing a pulse laser beam for the electrical activation of the conductive layers and the base layers in the source-drain regions; that is, it is important that the high-temperature heat treatment process for the electrical activation of the conductive layers and the base layers in the source-drain regions is the last high-temperature heat treatment process. If the semiconductor substrate is heated to a temperature of 600° C. or above in the process following the high-temperature heat treatment process for irradiating the semiconductor substrate with a pulse laser beam, the depth of the junction in the LDD structure or the source-drain region is increased. The heat treatment process following the high-temperature heat treatment process is a sintering process for forming an aluminum wiring layer, in which the process temperature is about 450° C.

BRIEF DESCRIPTION OF THE DRAWINGS

The above and other objects, features and advantages of the present invention will become more apparent from the following description taken in connection with the accompanying drawings, in which:

FIGS. 1(A), 1(B) and 1(C) are fragmentary, schematic sectional views of a semiconductor substrate in different stages of a method of fabricating a semiconductor device in a preferred embodiment according to the present invention.

DESCRIPTION OF THE PREFERRED EMBODIMENTS

Figure 2:
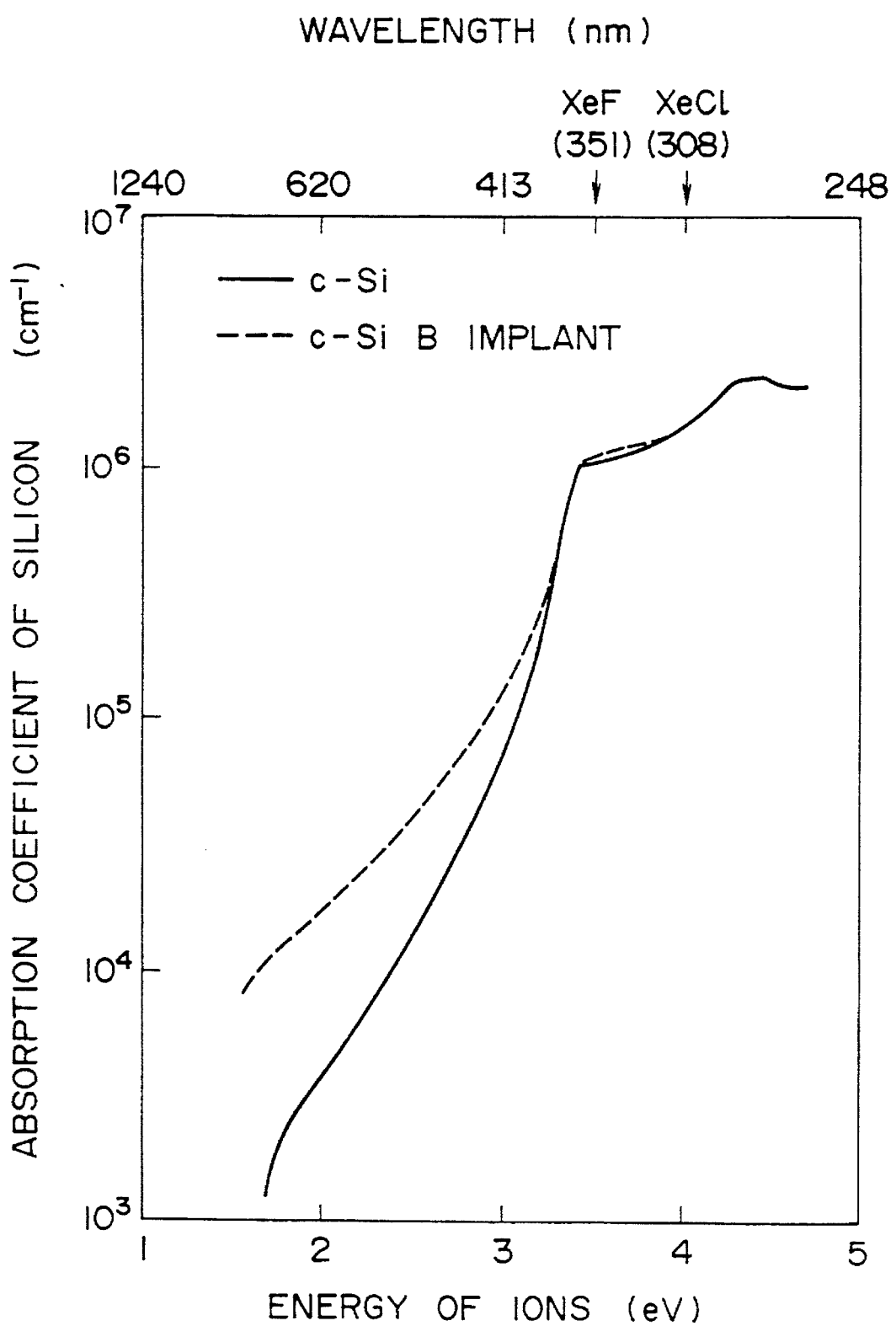
FIG. 2 is a graph showing the dependence of the absorption coefficient of silicon on the wavelength of light.

Referring to FIG. 1(A), element isolating regions 12 are formed in the surface of a semiconductor substrate 10 by a known process. Ion-implanted channel stop layers 16 underlie the element isolating regions 12. Then, a gate oxide film 18 is formed and an ion-implanted threshold voltage regulating layer 14 is formed under the gate oxide film 18. The gate oxide film 18 is coated with a gate polycrystalline silicon layer 20, a silicide layer 22 is formed, and the gate oxide film 18, the gate polycrystalline silicon layer 20 and the silicide layer 22 are etched to form a gate electrode region 24. Then, the semiconductor substrate thus processed is subjected to a furnace annealing process or a rapid thermal annealing process to activate those conductive layers and the base layers in the preceding processes and to reduce the resistance of the silicide layer 22. In this embodiment, the semiconductor substrate is subjected to a rapid thermal annealing process under annealing conditions of a temperature of 1050° C. and an annealing time of 10 sec. Then, if necessary, a LDD structure is formed. As shown in FIG. 1(B), the semiconductor substrate is subjected to an ion implanting process, and then, if necessary, the semiconductor substrate is subjected to an activating annealing process, in which the semiconductor substrate is irradiated with a pulse laser beam emitted by a XeCl laser to activate the ions implanted in the semiconductor substrate 10. Activating annealing conditions are 700 mJ/cm$^2$ for the energy of the pulse laser beam, and 44 nsec for the pulse width of the pulse laser beam.

Then, as shown in FIG. 1(C), the side surfaces of the gate electrode region 24 are coated with side spacing layers 26 by a known process, and ions are implanted in source-drain regions 28. When As$^+$ ions are implanted in the source-drain regions 28, the energy of As$^+$ ions is in the range of 5 to 20 kev and the dose is in the range of $1\times10^{15}$ to $3\times10^{15}$/cm$^2$. When BF$_2^+$ ions are implanted in the source-drain regions 28, the energy of BF$_2^+$ ions is in the range of 5 to 20 kev and the dose is in the range of $1\times10^{15}$ to $3\times10^{15}$/cm$^2$.

Then, the semiconductor substrate is irradiated with a pulse laser beam emitted by a XeCl laser for an activating annealing process to activate the ions implanted in the source-drain regions 28. The pulse laser beam has energy of 700 mJ/cm$^2$ and a pulse width of 44 nsec.

Then, the semiconductor substrate is subjected to known processes to complete a semiconductor device. It is important that the semiconductor substrate is not heated at temperatures exceeding 600° C.

Although the invention has been described in its preferred form with a certain degree of particularity, obviously many changes and variations are possible therein. It is therefore to be understood that the present invention may be practiced otherwise than as specifically described herein without departing from the scope and spirit thereof.

What is claimed is:

1. A method of fabricating a semiconductor device, comprising the steps of:

providing a semiconductor substrate having element isolating regions in the substrate, and ion-implanting channel stop layers underlying said element isolating regions;

forming a gate oxide film at a location for a gate between the element isolating regions on a surface of the substrate, forming an ion-implanted threshold voltage regulating layer under the gate oxide film in the substrate, coating the gate oxide film with a gate polycrystalline layer, forming a silicide layer on the gate polycrystalline layer, and etching the gate oxide film, the gate polycrystalline layer, and the silicide layer to form a gate electrode region, said silicide layer having a resistance;

prior to formation of source and drain regions, subjecting the semiconductor substrate to an annealing process with an annealing temperature greater than 850° C. comprising one of a furnace annealing process or a rapid thermal annealing process for activating the ion implanted channel stop layers, the ion implanted threshold voltage regulating layer, and the gate polycrystalline layer, and for reducing said resistance of said silicide layer;

in an ion implanting process, implanting ions into the semiconductor substrate to provide shallow junction source and drain regions having a depth not greater than 100 nm, said source and drain regions flanking the gate electrode region; and subjecting the source and drain regions to an activating annealing process for activating the ions implanted in the source and drain regions, said activating annealing process comprising irradiating the substrate with a pulse laser beam which results in the activating of the implanted ions in the source and drain regions without deepening the shallow junction source and drain regions since said pulse laser beam influences only a surface layer in the semiconductor substrate having a thickness no greater than 100 nm.

2. A method of fabricating a semiconductor device, comprising the steps of:

providing a semiconductor substrate having element isolating regions in the substrate, and ion-implanting channel stop layers underlying said element isolating regions;

forming a gate oxide film at a location for a gate between the element isolating regions on a surface of the substrate, forming an ion-implanted threshold voltage regulating layer under the gate oxide film in the substrate, coating the gate oxide film with a gate polycrystalline layer, forming a silicide layer on the gate polycrystalline layer, and etching the gate oxide film, the gate polycrystalline layer, and the silicide layer to form a gate electrode region, said silicide layer having a resistance;

prior to formation of source and drain regions, subjecting the semiconductor substrate to an annealing process with an annealing temperature greater than 850° C. comprising one of a furnace annealing process or a rapid thermal annealing process for activating the ion implanted channel stop layers, the ion implanted threshold voltage regulating layer, and the gate polycrystalline layer, and for reducing said resistance of said silicide layer;

forming an LDD structure in the substrate flanking the gate electrode region at both sides by subjecting the substrate to a first ion implanting process and then subjecting the substrate to a first activating annealing process in which the semiconductor substrate is irradiated to activate ions implanted in the substrate in the first ion implanting process;

in a second ion implanting process, implanting ions into the semiconductor substrate to provide shallow junction source and drain regions formed by the ions implanted in the second implantation process having a depth not greater than 100 nm, said source and drain regions flanking the gate electrode region; and subjecting the source and drain regions to a second activating annealing process for activating the ions implanted in the second ion implantation process in the source and drain regions, said second activating annealing process comprising irradiating the substrate with a pulse laser beam which results in the activating of the ions implanted in the second ion implantation process in the source and drain regions without deepening the shallow junction source and drain regions since said pulse laser beam influences only a surface layer in the semiconductor substrate having a thickness no greater than 100 nm.

3. A method according to claim 2, including the step of coating side surfaces of the gate electrode region with side spacing layers prior to the ion implantation of the source and drain regions.

4. A method according to claim 2 wherein the annealing with the annealing temperature greater than 850° C. process comprises said furnace annealing process.

5. A method according to claim 4 wherein the furnace annealing process is performed in the temperature range of 850°–1150° C. with an annealing period in a range of 10–30 minutes.

6. A method according to claim 2 wherein said annealing process with the annealing temperature greater than 850° C. comprises said rapid thermal annealing process.

7. A method according to claim 6 wherein the rapid thermal annealing process occurs in a temperature range of 850°–1150° C. and an annealing period of 5–10 seconds.

8. A method according to claim 2 wherein said pulse laser beam comprises an XeF laser beam.

9. A method according to claim 2 wherein said pulse laser beam comprises an XeCl laser beam.

10. A method according to claim 2 wherein said pulse laser beam has an energy density in a range of 650–1100 mJ/cm$^2$.

11. A method according to claim 2 wherein the pulse laser beam anneals for a period of 100 sec.

* * * * *